United States Patent [19]

Nogami et al.

[11] Patent Number: 5,106,724
[45] Date of Patent: Apr. 21, 1992

[54] DEVELOPER FOR LIGHT-SENSITIVE LITHOGRAPHIC PRINTING PLATE CAPABLE OF PROCESSING COMMONLY THE NEGATIVE-TYPE AND THE POSITIVE-TYPE AND DEVELOPER COMPOSITION FOR LIGHT-SENSITIVE MATERIAL

[75] Inventors: Akira Nogami; Minoru Seino; Masafumi Uehara; Miegi Nakano, all of Hino, Japan

[73] Assignee: Konica Corporation, Tokyo, Japan

[21] Appl. No.: 532,370

[22] Filed: Jun. 1, 1990

Related U.S. Application Data

[63] Continuation of Ser. No. 155,045, Feb. 11, 1988, abandoned.

[30] Foreign Application Priority Data

Feb. 16, 1987 [JP] Japan .................................. 62-33887
Apr. 28, 1987 [JP] Japan .................................. 62-107319

[51] Int. Cl.$^5$ .............................................. G03C 5/00
[52] U.S. Cl. .................................... 430/331; 430/149; 430/154; 430/302; 430/309
[58] Field of Search ............... 430/145, 149, 159, 195, 430/309, 193, 326, 331, 302, 154; 252/105, 150

[56] References Cited

U.S. PATENT DOCUMENTS

| | | | |
|---|---|---|---|
| 3,891,439 | 6/1975 | Katz et al. ........................... | 430/331 |
| 4,530,895 | 7/1985 | Simon et al. . | |
| 4,579,811 | 4/1986 | Schell et al. ........................ | 430/302 |
| 4,780,396 | 10/1988 | Hsieh et al. ......................... | 430/331 |

FOREIGN PATENT DOCUMENTS 0101010 8/1983 European Pat. Off. .
0186184 12/1985 European Pat. Off. .

OTHER PUBLICATIONS

Japanese Abstract No. 62-25761, vol. 11, No. 203 (P-591) (2650), Jul. 2, 1987.
Research Disclosure, No. 18620, Oct. 1979, pp. 575-576.

*Primary Examiner*—Ellis P. Robinson
*Assistant Examiner*—Donald J. Loney
*Attorney, Agent, or Firm*—Finnegan, Henderson, Farabow, Garrett and Dunner

[57] ABSTRACT

There are disclosed an aqueous alkaline developer for light-sensitive lithographic printing plate commonly processing a negative-type light-sensitive lithographic printing plate having a light-sensitive layer containing a diazo compound and a positive-type light-sensitive lithographic printing plate having a light-sensitive layer containing an o-quinonediazide compound, which comprises containing an alkali agent, 0.1 to 10% by weight of a water-soluble reducing agent, a sodium, potassium or ammonium salt of an organic carboxylic acid, and a non-ionic or cationic surfactant, and having a pH in the range of 12.5 to 13.5, and also a developer composition for light-sensitive material, which comprises an aqueous solution containing a compound represented by the formula (I) shown below:

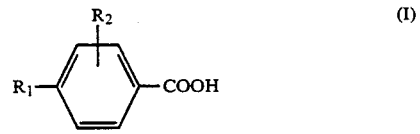

(I)

wherein $R_1$ represents an alkyl group or an alkoxy group each having 2 to 5 carbon atoms, or a hydroxyalkyl group having 2 to 5 carbon atoms; and $R_2$ represents a hydrogen atom, a halogen atom, an amino group, a hydroxyl group, an alkyl group, an alkoxy group or a phenyl group.

8 Claims, No Drawings

DEVELOPER FOR LIGHT-SENSITIVE LITHOGRAPHIC PRINTING PLATE CAPABLE OF PROCESSING COMMONLY THE NEGATIVE-TYPE AND THE POSITIVE-TYPE AND DEVELOPER COMPOSITION FOR LIGHT-SENSITIVE MATERIAL

This application is a continuation of application Ser. No. 07/155,045 filed Feb. 11, 1988, now abandoned.

BACKGROUND OF THE INVENTION

This invention relates to a developer and a developing method for a light-sensitive lithographic printing plate, and developer composition for light-sensitive material, particularly to a developer which can develop well commonly the negative-type and the positive type light-sensitive lithographic printing plate, and a developer composition which can suitably develop a wash-off type light-sensitive material having a water-insoluble image forming layer.

In the prior art, for the negative-type light-sensitive lithographic printing plate (hereinafter called the negative-type PS plate) and the positive-type lithographic printing plate (hereinafter called the positive-type PS plate), the compositions of the developers were different, and developing could be done suitably only with the respective developers. If developing can be effected with a developer which is not the developer for exclusive use, no lithographic printing plate having sufficient performance can be obtained, and under the present status it is substantially impossible to effect commonly well the processing of the negative-type PS plate and the positive-PS plate with a developer of the same recipe.

Japanese Provisional Patent Publication No. 64351/1985 discloses a common developing method in which the negative-type PS plate and the positive-type-PS plate are both developed with one automatic developing machine. However, this technique performs developing with the respective developers for exclusive use successively in separate developing zones, and does not perform developing with a developer of the same recipe.

Accordingly, since the respective developers for exclusive use are used, management of solutions is cumbersome and it is difficult to perform stable developing for a long time.

A developer which performs common developing with one kind of developer is disclosed in Japanese Provisional Patent Publication No. 237442/1985. This developer comprises an organic solvent of ethylene glycol monophenyl ether or ethylene glycol monobenzyl ether, a silicate, an alkali metal hydroxide, an anionic surfactant and a water-soluble reducing agent. However, such developer is extremely susceptible to foaming, and the developing speed was not sufficiently rapid for the negative-type PS plate. On the other hand, when the positive-type PS plate is developed, developing latitude was liable to change extremely the developing result, whereby a part of the image portion was corroded during developing to be under the state readily defected. This tendency is more marked when the developing time is slightly elongated, or when the developing temperature is slightly higher than the predetermined temperature, thereby causing sometimes defect of the fine portion of the image, and also poor printing resistance during printing.

On the other hand, the so-called wash-off type light-sensitive material which obtains a relief image by removing the non-image portion in development after imagewise exposure has been utilized in many uses, and as said light-sensitive material, there are, for example, resin letterpress, light-sensitive lithographic plate, (PS plate), resist for print wiring, non-silver salt lith-film, light-sensitive peel mask film, color proof film, dry film, etc. When these light-sensitive materials are to be developed, it is recently frequently practiced from the standpoint of pollution, safety and hygiene to process an aqueous developer of an alkali aqueous solution. However, light-sensitive materials contain lipophilic substances insoluble or difficultly soluble in water or alkali aqueous solution in many cases, and therefore development can proceed with difficulty, whereby it takes too much time for removal of the non-image portion or the image remains to be undeveloped in some cases. Also, the components removed cannot be sufficiently dissolved but float in the solution, whereby contamination may be sometimes caused by attachment of the floating components on the image portion and the non-image portion.

For solving this problem, the techniques of adding an organic solvent or a surfactant have been known as disclosed in Japanese Provisional Patent Publications No. 44202/1978 and No. 86328/1979 or the technique of using a specific organic carboxylic acid as disclosed in U.S. Pat. Nos. 4,579,811 and 3,891,439.

These techniques are directed to improvement of developability, but they are still insufficient, and moreover undesirable from the standpoint of odor, pollution, safty and hygiene for the necessity to use an organic solvent to some extent, and use of surfactant in large amount sometimes posed a problem in foaming.

SUMMARY OF THE INVENTION

An object of the present invention is to provide a developer which develop well negative-type and positive-type PS plates with one kind of developer.

Another object of the present invention is to provide a developer with broad developing latitude.

Another object of the present invention is to provide a developer with little foaming.

Another object of the present invention is to provide a developer which can rapidly develop negative-type and positive-type PS plates.

A further object of the present invention is to provide a developer composition which can develop suitably a light-sensitive material containing a substance insoluble or difficultly soluble in water or aqueous alkali solution.

A still further object of the present invention is to provide a developer composition little in odor and excellent in safety and hygiene.

A still further object of the present invention is to provide a developer composition which is little in foaming and good in workability.

The present inventors have studied intensively and consequently accomplished the above objects of the present invention by an aqueous alkaline developer which processes commonly the negative-type PS plate having a light-sensitive layer containing a diazo compound and the positive-type PS plate having a light-sensitive layer containing an o-quinonediazide, said developer containing an alkali agent, 0.1 to 10% by weight of a water-soluble reducing agent, an organic carboxylic acid or its salt, and a nonionic or cationic surfactant.

Further, the above objects of the present invention can be accomplished by a developer composition for light-sensitive material, comprising an aqueous solution containing a compound represented by the formula (I) shown below:

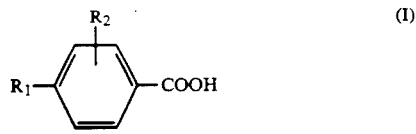

wherein $R_1$ represents an alkyl group or an alkoxy group each having 2 to 5 carbon atoms, or a hydroxyalkyl group having 2 to 5 carbon atoms; and $R_2$ represents a hydrogen atom, a halogen atom, an amino group, a hydroxyl group, an alkyl group, an alkoxy group or a phenyl group.

DESCRIPTION OF THE PREFERRED EMBODIMENTS

The present invention is described in detail below.

Useful alkali agents to be contained in the developer of the present invention may include, for example, inorganic alkali agents such as sodium silicate, potassium silicate, sodium hydroxide, lithium hydroxide sodium tertiary phosphate, sodium secondary phosphate, potassium tertiary phosphate, potassium secondary phosphate, ammonium tertiary phosphate, ammonium secondary phosphate, sodium metasilicate, sodium bicarbonate, sodium carbonate, potassium carbonate, ammonium carbonate and the like; organic alkali agents such as mono-, di- or triethanolamine and tetraalkylammonium hydroxide and the like; and organic ammonium silicate; etc. Among these alkali agents, silicates of alkali metals are particularly preferred.

The content of the alkali agent in the developer may be suitably in the range of 0.05 to 20% by weight, more preferably 0.1 to 10% by weight.

Water-soluble reducing agents to be used in the developer of the present invention may include organic and inorganic reducing agents.

Examples of organic reducing agents may include phenol compounds such as hydroquinone, Metol, methoxyquinone, etc., amine compounds such as phenylenediamine, phenylhydrazine, etc., and examples of inorganic reducing agents may include, sulfites such as sodium sulfite, potassium sulfite, ammonium sulfite, sodium hydrogen sulfite, potassium hydrogen sulfite and the like; phosphates such as sodium phosphite, potassium phosphite, sodium hydrogen phosphite, potassium hydrogen phosphite, sodium dihydrogen phosphite, dipotassium hydrogen phosphite, hydrazine, sodium thiosulfate, sodium dithionite, etc. The reducing agent having particularly excellent effect in the present invention is a sulfite.

The meaning of "water-soluble" of the above water-soluble reducing agent is inclusive of alkali solubility, and these water-soluble reducing agents are contained in the range of 0.1 to 10% by weight, more preferably 0.5 to 5% by weight.

The organic carboxylic acid to be contained in the developer of the present invention may be preferably an aliphatic carboxylic acid having 6 to 20 carbon atoms and an aromatic carboxylic acid having carboxylic group substituted on a benzene ring or a naphthalene ring.

The aliphatic carboxylic acid may be preferably an alkanoic acid having 6 to 20 carbon atoms, including specifically caproic acid, enanthylic acid, caprylic acid, peralgonic acid, capric acid, lauric acid, myristic acid, palmitic acid, stearic acid, etc., particularly preferably an alkanoic acid having 6 to 12 carbon atoms. Also, a fatty acid having a double bond in the carbon chain or a branched carbon chain may be available. The above aliphatic carboxylic acid may be preferably used in the form of a salt of sodium or potassium or ammonium salt for the purpose of enhancing water solubility.

Specific examples of the aromatic carboxylic acid may include benzoic acid, o-chlorobenzoic acid, p-chlorobenzoic acid, p-hydroxybenzoic, acid, o-aminobenzoic acid, o-hydroxybenzoic acid, 2,4-dihydroxybenzoic acid, 2,5-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, 2-naphthoic acid, etc. Among them, hydroxynaphthoic acids are particularly effective. The above aromatic carboxylic acids should preferably be employed in the form of salts of sodium or potassium or ammonium salts for the purpose of enhancing water solubility.

The content of the aliphatic carboxylic acid, aromatic carboxylic acid to be added in the developer to be used in the present invention is not particularly limited, but if it is lower than 0.1% by weight, the effect is not sufficient, while if it is over 30% by weight, not only no further effect can be obtained but also solubility of another additive, when used in combination, may be impaired. Accordingly, the amount added may be preferably 0.1 to 10 % by weight, more preferably 0.5 to 4% by weight.

Further, in the developer according to the present invention, a nonionic or cationic surfactant is contained.

As the nonionic surfactant, various compounds can be used, which can be classified broadly into polyethylene glycol type compounds and polyhydric alcohol type compounds, and polyethylene glycol type compounds can be more preferably used. Among them, nonionic surfactants having a structure of recurring oxyethylene units of 3 or more and a HLB (Hydrophile-Lipophile Balance) value of 5 or higher, more preferably 10 to 20, are suitable. More specifically, the above preferable nonionic surfactants may be represented by the formulae shown below.

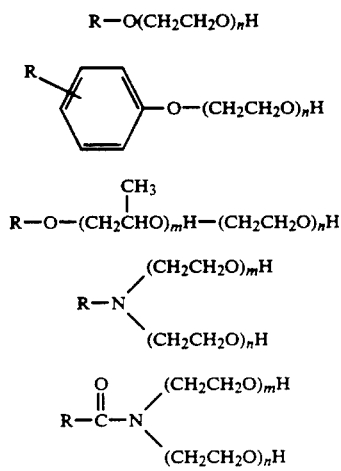

-continued $$HO(C_2H_4O)_a\text{—}(C_3H_5O)_b\text{—}(C_2H_4O)_cH$$

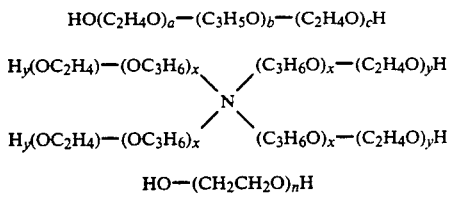

$$HO\text{—}(CH_2CH_2O)_nH$$

(wherein n, m, a, b, c, x and y are each an intefer of 1 to 40).

Specific examples of the compounds represented by the above formula are shown below.

For example, there may be included polyethyleneglycol, polyoxyethylene lauryl ether, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether,, polyoxyethylene phenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glycerylmonooleate, polyoxyethylene glycol monostearate, polyoxyethylene propylene glycol monostearate, oxyethylene-oxypropylene block polymer, distyrenated polyethylene oxide adduct, octylphenylpolyoxyethylene polyoxypropylene adduct, tribenzylphenol polyethylene oxide adduct, glycerol monostearate, sorbitane monolaurate, polyoxyethylene sorbitane monolaurate, etc.

These nonionic surafactants may be added in amounts ranging from 0.001 to 5% by weight, more preferably from 0.01 to 0.3% by weight.

Also, these nonionic surfactants may have weight average molecular weights ranging preferably from 300 to 50,000, more preferably from 500 to 5,000.

In the present invention, nonionic surfactants may be used either alone or as a combination of two or more kinds.

As the cationic surfactant to be used in the present invention, various compounds may be employed, but preferably organic amine type compounds and quaternary ammonium type compounds.

Examples of organic amine type compounds may include polyoxyethylene alkylamine, N-alkylpropylenediamine, N-alkylpolyethylenepolyamino dimethylsulfate, N-alkylpolyethylenepolyamine dimethylsulfate, long-chain amineoxide, alkylimidazoline, 1- hydroxyethyl-2-alkylimidazoline, 1-acetylaminoethyl-2-alkylimidazoline, 2-alkyl-4-methyl-4-hydroxymethyloxazoline, etc.

Examples of quaternary ammonium salt type compounds may include long-chain primary amine salts, alkyltrimethylammonium salts, dialkyldimethylammonium salts, alkylmethylammonium salts, alkyldimethyl ammonium salts, alkylpyridinium salts, alkylquinolium salts, alkylisoquinolium salts, alkylpyridinium sulfates, steamidomethylpyridinium salt, acylaminoethyldiethylamine salts, acylaminoethyldiethylammonium salts, alkylamidopropyldimethylbenzylammonium salts, fatty acid polyethylenepolyamidoacylaminoethylpyridinium salts, acylcolaminoformylmethylpyridinium salts, stearooxymethylpyridinium salts, fatty acid triethanolamines, fatty acid triethanolamine formic acid salts, trioxyethylene fatty acid triethanolamines, fatty acid dibutylaminoethanols, cetyloxymethylpyridinium salts, p-isoctylphenoxyethylbenzylammonium salts, etc.

Among these, particularly cationic surfactants of water-soluble quaternary ammonium salts are excellent in effect, including alkyltrimethylammonium salts, alkyldimethylbenzylammonium salts, ethylene oxide adduct ammonium salts, etc. Also, polymers having cationic components as recurring units are generally cationic surfactants and effective. Particularly, polymers containing quaternary ammonium salts obtained by copolymerization with a lipophilic monomer can be suitably used. The amount of the above cationic surfactant added may be 0.01 to 5% by weight, more preferably 0.01 to 3% by weight, similarly as the nonionic surfactant. Also, its weight average molecular weight may be in the range of 300 to 50,000, particularly preferably from 500 to 5,000.

These cationic surfactants may be used alone, or a combination of two or more kinds may be also used.

Further, in the present invention, the effect of the present invention can be obtained by using a nonionic surfactant and a cationic surfactant in combination.

In the developer of the present invention, further additives can be added, and among them, organic solvents with a solubility of 10% by weight or less in water are particularly effective.

Examples of organic solvents with a solubility of 10% or less in water may include carboxylic acid esters such as ethyl acetate, propyl acetate, butyl acetate, amyl acetate, benzyl acetate, ethylene glycol monobutylacetate, butyl lactate, butyl levulinate; ketones such as ethyl butyl ketone, methyl isobutyl ketone, cyclohexanone; alcohols such as ethylene glycol monobutyl ether, ethylene glycol benzyl ether, ethylene glycol monophenyl ether, methyl phenyl carbinol, n-amyl alcohol, methylamyl alcohol, benzyl alcohol and phenylcellosolve; alkyl-substituted aromatic hydrocarbons such as xylene; alogenated hydrocarbons such as methylene dichloride, ethylene dichloride, monochlorobenzene; and N-phenylethanol amine and N-phenyldiethanol amine. One or more kinds of these organic solvents may be used. Among these organic solvents, ethylene glycol monophenyl ether, ethylene glycol benzyl ether are particularly preferred.

Said organic solvent is an excellent additive for improving developability for both PS plates of the negative-type and the positive-type, but it has at the same time the drawback of deteriorating the film at the image portion for the positive-type PS plate. Since the positive-type PS plate undergoes no such cross-linking reaction as the negative-type PS plate during exposure, deterioration of the film is inherently great when development is effected excessively, and the extent of deterioration becomes further greater in the presence of an organic solvent. The present inventors have studied intensively and consequently found that a nonionic or cationic surfactant should be added in the developer preferably in an amount ranging from 0.001 to 10% by weight in order to prevent deterioration of the film during development of the positive-type PS plate and also to develop well the negative-type PS plate.

The pH of the developer according to the present invention is in the range of 12.5 to 13.5. When the negative-type PS plate is developed at such high pH (pH:

11.5 or higher), in certain kind of plate, contamination may sometimes occur in spite of development of the plate. The extent of contamination depends on pH and contamination is liable to occur as the pH is higher. For effecting good development of the negative-type PS plate and eliminating contamination at such high pH, it is very effective to incorporate a sulfite in the developer, and also addition of an anionic surfactant exhibits a great effect for acceleration of developing of particularly the negative-type PS plate by use of a polymer with a low acid value.

The developer of the present invention having such a composition has a pH of 12.5 to 13.5 as mentioned above, and outside the pH range, no effective result can be obtained when common developing is practiced for the negative-type PS plate and the positive-type PS plate. That is, if pH is lower than 12.5, developing of the positive-type PS plate is liable to be insufficient, while developability of the negative-type PS plate will be deteriorated if pH exceeds 13.5. And, residual film tends to be formed readily, thereby causing frequently ink contamination during printing. In the case of the positive-type PS plate, developing tends to become excessive, thereby causing defect at the image fine portion or corrosion of sandblast surface.

A particularly preferably embodiment of the developer of the present invention is the embodiment in which a silicate of an alkali metal is used as the alkali agent, a sulfite is used as the water-soluble reducing agent, at least one selected from n-alkanoic acids having 6 to 20 carbon atoms and hydroxynaphthoic acid is used as the organic carboxylic acid, at least one selected from nonionic surfactant containing ethylene oxide groups and cationic surfactant containing quaternary ammonium salts is used as the nonionic or cationic surfactant, and the content of said surfactant is made in the range from 0.01 to 1.0% by weight, and the effect of the present invention is particularly remarkable in this embodiment.

Also, in the developer to be used in the present invention, the following additives can be added for further enhancing developing performance. For example, there may be included neutral salts such as NaCl, KCl, KBr, etc. as disclosed in Japanese Provisional Patent Publication No. 75152/1983, chelating agents such as EDTA, NTA, etc. as disclosed in Japanese Provisional Patent Publication No. 190952/1984, complexes such as [Co(NH$_3$)]$_6$Cl$_3$, etc. as disclosed in Japanese Provisional Patent Publication No. 121336/1984, amphoteric polymeric electrolytes such as copolymer of vinylbenzyltrimethylammonium chloride and sodium acrylate as disclosed in Japanese Provisional Patent Publication No. 142528/1981, inorganic lithium compounds such as lithium chloride, etc. as disclosed in Japanese Provisional Patent Publication No. 59444/1983, organic lithium compounds such as lithium benzoate, etc. as disclosed in Japanese Provisional Patent publication No. 34442/1975, organometallic surfactants containing Si, Ti as disclosed in Japanese Provisional Patent Publication No. 75255/1984, organic boron compounds as disclosed in Japanese Provisional Patent Publication No. 84241/1984.

Next, another embodiment of the present invention will be explained in detail.

Examples of the compound represented by the above formula (I) may include p-ethylbenzoic acid, p-n-propylbenzoic acid, p-isopropylbenzoic acid, p-n-butylbenzoic acid, p-t-butylbenzoic acid, p-n-amylbenzoic acid, 2-hydroxy-4-n-propylbenzoic acid, 2-chloro-4-isopropylbenzoic acid, p-2-hydroxyethylbenzoic acid, p-ethoxybenzoic acid, p-n-propoxybenzoic acid, p-i-propoxybenzoic acid, p-t-butoxybenzoic acid, p-2-hydroxypropylbenzoic acid, 2-phenyl-4-n-propylbenzoic acid, 2-chloro-4-t-butylbenzoic acid, etc., and among them, particularly preferred are p-n-propylbenzoic acid, p-isopropylbenzoic acid and p-t-butylbenzoic acid.

Since most of the compounds represented by the above formula (I) are difficultly soluble in water, it is generally preferable to use them as salts formed by the reaction with alkali agents. Preferably, sodium salt, potassium salt, amine salt are preferred.

In the present invention, the concentration range of the compound of the formula (I) in an aqueous solution is not particularly limited, but it can be used effectively within a broad range permissible by solubility. However, its effect is not sufficient if it is lower than 0.1% by weight of the developer, while at a concentration of 50% by weight or more, the effect is saturated, and moreover there will ensue such drawbacks that other additives to be used in combination become difficultly soluble or that the viscosity is increased to make handling of the solution difficult. Accordingly, as a general measure, the concentration may be 0.1 to 50% by weight, more preferably 1 to 20% by weight.

The developer composition of the present invention comprises basically an aqueous solution containing a compound represented by the above formula (I), but better effect can be exhibited when various additives are further used in combination. Particularly preferable additives to be used in combination may include alkali agents, anionic surfactants, water-soluble reducing agents.

Examples of the alkali agent may include those as mentioned above. The content thereof is the same as mentioned above.

Examples of the anionic surfactant may include higher alcohol (C$_8$ to C$_{22}$) sulfuric acid ester salts [e.g., sodium salt of lauryl alcohol sulfate, sodium salt of octyl alcohol sulfate, ammonium salt of lauryl alcohol sulfate, "Teepol B-81" (trade name, produced by Shell Chemical), secondary sodium alkylsulfate, etc.], aliphatic alcohol phosphoric acid ester salts (e.g., sodium salt of cetyl alcohol phosphate), alkylarylsulfonic acid salts (e.g., sodium dodecylbenzenesulfonate, sodium isopropylnaphthalenesulfonate, sodium dinaphthalene sulfonate, sodium metanitrobenzenesulfonate, etc.), sulfonic acid salts of alkylamide (e.g.,

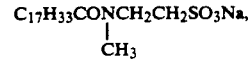

etc.), sulfonic acid salts of di-basic fatty acid esters (e.g., sodium dioctylsulposuccinate, sodium dihexylsulfosuccinate, etc.). Among them, alkylnaphthalene sulfonic acid salts are particularly preferably employed.

These anionic surfactants may be added in amounts ranging from 0.1 to 20% by weight, more preferably from 1.0 to 10% by weight.

Water-soluble reducing agents may be mentioned those as mentioned above. The content thereof is the same as mentioned above.

The present invention can afford a completely aqueous developer containing no organic solvent at all by containing a compound represented by the above formula. However, addition of an organic solvent in a slight amount will pose no problem with respect to drawbacks inherent in organic solvent such as odor, inflammability, toxicity, etc. Accordingly, even when such a solvent may be added in a small amount, the solution remain substantially an aqueous developer, and developability can be further improved. Organic solvents particularly effective in the present invention may include those slightly soluble in water, as exemplified by specific compounds such as benzyl alcohol, phenyl cellosolve, propylene glycol monophenyl ether, 3-phenyl-1-propanol, 4-phenyl-1-butanol, 4-phenyl-2-butanol, methoxybenzyl alcohol, cyclohexanol, N-phenyldiethanolamine, N-phenylethanolamine, etc. The content of the organic solvent may be 0.1 to 10% by weight, preferably 0.5 to 4% by weight.

The light-sensitive material suitable for processing with the developer composition of the present invention has an image forming layer containing a component which is insoluble or difficultly soluble in water or an aqueous alkali solution, particularly suitably a light-sensitive material containing a water-insoluble substance or a high molecular weight polymer having a lipophilic group. Also, the developer composition of the present invention is suitable for the type which removes the non-image portion by development, namely the so-called wash-off type light-sensitive material. The wash-off type light-sensitive material in which the portion irradiated with light by active rays is hardened to become insoluble in the developer and remain as the image portion, and the positive-type light-sensitive material in which the portion irradiated with light by active rays is increased in solubility in the developer to be removed by development and the non-irradiated portion remain as the image. The present invention can function for both the negative-type and the positive-type light-sensitive materials, particularly with greater effect for the negative-type light-sensitive material.

Specific examples of such wash-off type light-sensitive materials may include light-sensitive lithographic printing plate, resin letterpress, color proof film, resist for print wiring, non-silver salt reverse film, light-sensitive peel mask film, etc. Among them, light-sensitive lithographic printing plate uses a highly lipophilic component for permitting the image portion to receive easily an oily ink, and the lipophilic component is required to be removed completely at the non-image portion during development, and therefore the present invention can be applied with a great effect.

The light-sensitive composition for the PS plate to be used in the present invention or the image-forming layer in the light-sensitive material of the present invention contains a light-sensitive substance as the essential component, and such light-sensitive substances may include those which are altered in their physical, chemical properties by exposure or subsequent developing processing, for example, those creating difference in solubility in the developer by exposure, those creating difference in adhesive force between molecules before and after exposure, those creating difference in affinity for water and oil by exposure or subsequent developing processing, and further those capable of forming multi-layer constitution as disclosed in Japanese Provisional Patent Publication No. 166645/1980. Representative of light-sensitive substance are, for example, light-sensitive diazo compounds, light-sensitive azide compounds, compounds having ethylenically unsaturated double bond, epoxy compounds which undergo polymerization with an acid catalyst, compounds having C—O—C group decomposable with an acid, etc. Representative positive-type substances which are changed to alkali soluble by exposure may include o-quinoneazide compound, acid decomposable ether compounds, ester compounds, etc. The negative-type substances which are reduced in solubility by exposure may include aromatic diazonium salts, etc.

Specific examples of o-quinonediazide compounds may include those as described in Japanese Provisional Patent Publications No. 5303/1972, No. 63802/1973, No. 63803/1973, No. 38701/1974, No. 1044/1981 and No. 1045/1981; Japanese Patent Publications No. 11222/1966, No. 28403/1968, No. 9610/1970 and No. 17481/1974; U.S. Pat. Nos. 2,797,213, No. 3,046,120, No. 3,188,210, No. 3,454,400, No. 3,544,323, No. 3,573,917, No. 3,674,495 and No. 3,785,825; British Patents No. 1,227,602, No. 1,251,345, No. 1,267,005, No. 1,329,888 and No. 1,330,932; and German Patent No. 854,890, and examples of acid decomposable compounds may include those disclosed in Japanese Provisional Patent Publications No. 37549/1985, No. 10247/1985 and No. 3625/1985; etc. The present invention can be applied at least preferably for the PS plate in which these compounds are used singly or in combination as the light-sensitive component.

These light-sensitive components are inclusive of o-quinonediazidecarboxylic acid esteror o-quinonediazidecarboxylic acid of aromatic hydroxy compound and o-quinonediazide sulfonic acid or o-quinonediazidecarboxylic acid amide of aromatic amino compound. Also, the present invention is to inclusive of both the embodiments in which these o-quinonediazide compounds are individually used, and in which a mixture with an alkali soluble resin is provided as the light-sensitive layer.

The alkali soluble resin may include novolac type phenol resins specifically phenol formaldehyde resin, cresol formaldehyde resin, phenol-cresol mixed formaldehyde resin, cresol-xylenol mixed formaldehyde resin, etc. Further, as disclosed in Japanese Provisional Patent Publication No. 125806/1975, it is also possible to apply a combination of a condensed product of a phenol or cresol substituted with an alkyl group having 3 to 8 carbon atoms and formaldehyde such as t-butylphenol formaldehyde resin together with a phenol resin as mentioned above. In the light-sensitive layer containing o-quinonediazide compound as the light-sensitive component, additives such as dyes, plasticizers, components capable of giving print-out performance, etc. can be further added, if necessary.

The amount of the light-sensitive layer containing an o-quinonediazide compound as the light-sensitive component per unit area, for which the present invention is applicable, may be preferably about 0.5 to 7 g/m$^2$.

Imagewise exposure of the positive-type PS plate for which the method of the present invention is applied is not required to be particularly changed, but may follow a conventional method.

Representative of the light-sensitive component in the negative-type light-sensitive layer are diazo compounds, including, for example, diazo resins which are condensates of diazonium salts and/or p-diazophenylamine with formaldehyde; phenol salts or fluorocapric acid salts of p-diazophenylamines as disclosed in Japanese Patent Publication No. 7364/1977; diazo resins comprising organic solvent soluble salts of copolycondensates of 3-methoxydiphenylamine-4-diazonium chloride and 4-nitrodiphenylamine with formaldehyde as disclosed in Japanese Patent Publication No. 48001/1974; 2-methoxy-4-hydroxy-5-benzoylbenzene-sulfonic acid salt of the condensate of p-diazodiphenylamine and formaldehyde, a tetrafluoroboric acid salt, hexafluorophosphoric acid salt of the condensate of p-diazophenylamine and formaldehyde, etc. The present invention is applicable preferably for at least the negative-type light-sensitive lithographic printing plate containing these as the light-sensitive component.

Other than those in which these diazo compounds are individually used, the present invention is also applicable for those in which various resins are used as a mixture with such compounds for improvement of physical properties of the light-sensitive layer. Such resins may include, in addition to shellac, polyvinyl alcohol derivatives, copolymers having alcoholic hydroxyl groups in the side chain as disclosed in Japanese Provisional Patent Publication No. 118802,/1975, copolymers having phenolic hydroxyl group in the side chain as disclosed in Japanese Provisional Patent Publication No. 155355/1980.

Among these resins are included copolymers containing at least 50% by weight of the structural unit represented by the formula shown below:

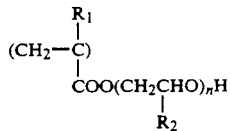

(wherein $R_1$ represents a hydrogen atom or a methyl group, $R_2$ represents a hydrogen atom, a methyl group, an ethyl group or a chloromethyl group, and n is an integer of 1 to 10) and polymeric compounds having 1 to 80 mole % of monomeric units having aromatic hydroxyl group, 5 to 90 mole % of monomeric units of acrylic acid ester and/or methacrylic acid ester, and having an acid value of 10 to 200.

In the light-sensitive layer of the negative-type light-sensitive material for which the developer composition and the developing method of the present invention are applied, further additives such as dyes, plasticizers, components which give print-out performance, etc. can be also added.

The present invention is applicable for at least the amount in the range of 0.1 to 7 g/m² per unit area of the above light-sensitive layer.

As the support to be used in the light-sensitive material or lithographic printing plate according to the present invention, there may be included plastics (e.g., polyethylene, polypropylene, polystyrene, etc.), laminated paper, plates of metal such as aluminum (including aluminum alloys), zinc, copper, etc., films of plastics such as cellulose diacetate, cellulose triacetate, cellulose propionate, polyethylene terephthalate, polyethylene, polypropylene, polycarbonate, polyvinyl acetal, etc., papers having metals as mentioned above laminated or vapor deposited thereon or steel plate applied with chromium plating, etc., and among them, aluminum and composite supports coated with aluminum are preferred.

Also, the surface of aluminum material should be desirably subjected to the roughening treatment for the purpose of enhancing water retentivity and improving adhesiveness with the light-sensitive layer.

As the surface roughening method, there may be generally employed the brush polishing method, the ball polishing method, electrolytic etching, chemical etching, liquid horning, sandblasting, etc. and combination of these, preferably the brush polishing method, electrolytic etching, chemical etching and liquid horning. Among them, the roughening method including the use of electrolytic etching is particularly preferred. Also, as the electrolytic bath to be used during electrolytic etching, an aqueous solution containing an acid, an alkali or a salt thereof or an aqueous solution containing an organic solvent may be used. Among them, an electrolyte containing hydrochloric acid, nitric acid or a salt thereof is particularly preferred. Further, the aluminum plate applied with the roughening treatment may be subjected to the desmatting treatment with an aqueous solution of an acid or an alkali, if necessary.

The aluminum plate thus obtained should be desirably subjected to the anodic oxidation treatment, particularly preferably the method in which treatment is conducted in a bath containing sulfuric acid or phosphoric acid. Also, the plate may be further subjected to, if necessary, the sealing treatment and other surface treatment such as dipping in an aqueous fluorinated potassium zirconate solution, etc.

Also, the developing processing method by use of the developer according to the present invention may include, if necessary, in addition to the developing processing step, individually the developing stopping processing step (the stopping processing solution may include the disposal system and the system for recirculation use) and the desensitization step after the developing processing, the processing steps in which the developing stopping processing step and the desensitization step subsequent thereto, the developing processing and the desensitization step are combined, or the processing steps in which the developing stopping processing and the desensitization step are combined, for example, the processing steps as disclosed in Japanese Provisional Patent Publication No. 8001/1979., etc.

When the negative-type and positive-type PS plate in the present invention are commonly developed with the same developer, other conditions than the developer (e.g., developing temperature, developing time, etc.) can be varied for the negative-type and the positive-type freely as desired.

EXAMPLES

The present invention will be described in more detail below by referring to specific Examples, by which the present invention is not limited at all.

EXAMPLE 1

Under nitrogen gas stream, 300 parts by weight of ethylene glycol monomethyl ether was heated to 100° C., and a mixture of 150 parts by weight of 2-hydroxyethyl methacrylate, 90 parts by weight of acrylonitrile, 79.5 parts by weight of methyl methacylate, 10.5 parts by weight of methacrylic acid and 1.2 parts by weight of benzoyl peroxide was added dropwise thereinto over 2 hours.

After 15 minutes after completion of the dropwise addition, 300 parts by weight of ethylene glycol monomethyl ether and 0.3 parts by weight of benzoyl peroxide were added, and the reaction was carried out as such for 4 hours. After completion of the reaction, the reaction product was diluted with methanol, thrown into water to precipitate the copolymer, which was then vacuum dried at 70° C. The 2-hydroxyethyl methacrylate copolymer (1) had an acid value of 21.

A 2S aluminum plate with a thickness of 0.15 mm was defatted by dipping in an aqueous 10% sodium tertiary phosphate solution maintained at 80° C. for 3 minutes, and after sandblasting with a Nylon (trade name) brush, desmatted with an aqueous 3% sodium aluminate solution. The aluminum plate was anodically oxidized in 20% sulfuric acid at a current density of 2 A/dm$^2$, and then treated in an aqueous 25% sodium silicate solution at 70° C. for 1 minute.

The aluminum plate was coated with the following light-sensitive solution and dried at 100° C. for 2 minutes to obtain a negative-type PS plate.

| | |
|---|---|
| 2-Hydroxyethyl methacrylate copolymer (1) | 87 parts by weight |
| 2-Methoxy-4-hydroxy-5-benzoylbenzene-sulfonic acid salt of condensate of p-diazodiphenylamine and papa-formaldehyde | 10 parts by weight |
| Oil Blue #603 (produced by Orient Kagaku Kogyo K.K., triphenylmethane type oil-soluble dye) | 3 parts by weight |
| 2-Methoxyethanol | 600 parts by weight |
| Methanol | 600 parts by weight |
| Ethylene dichloride | 600 parts by weight |

The dry coating weight was found to be 2.5 g/m$^2$.

The PS plate was contacted with a step wedge and a negative original with dots and subjected to imagewise exposure by a carbon arc lamp of 30 ampere at a distance of 70 cm therefrom for 40 seconds.

On the other hand, as the positive-type PS plate, a light-sensitive solution prepared by dissolving 1 part by weight of naphthoquinone-1,2-diazide-5-sulfonic acid ester of polyhydroxyphenyl obtained by polycondensation of acetone and pyrogallol, 2 parts by weight of a novolac type cresolformaldehyde resin, 0.03 part by weight of Oil Blue #603 in 20 parts by weight of acetic acid-2-methoxyethylene and 20 parts by weight of methyl ethyl ketone was applied on the anodically oxidized aluminum plate after sandblasting, followed by drying at 80° C. for 2 minutes to obtain a PS plate with a dry coating amount of 2.5 g/m$^2$ as disclosed in Example 1 of U.S. Pat. No. 3,635,709. The positive-type plate was contacted with a step wedge original picture and subjected to imagewise exposure by a carbon arc lamp of 30 ampere at a distance of 70 cm therefrom for 60 seconds.

As described above, the exposed negative-type and positive-type PS plates were developed by means of an automatic developing machine PSP-860 (produced by Konishiroku Photo Industry Co., Ltd.) at 27° C. for 20 seconds with the use of the following developer (A).

The pH of the developer was adjusted to 12.90 with NaOH during usage.

| Developer (A) (present invention) | |
|---|---|
| Sodium silicate JIS No. 3 | 3.0 parts by weight |
| Potassium sulfite | 0.5 part by weight |
| 3-Hydroxy-2-naphthoic acid | 2.0 parts by weight |
| Nikkol BO-20 (nonionic surfactant, polyethylene dioxyoleyl ether, produced by Nikko Chemicals K.K.) | 0.1 part by weight |
| Phenyl cellosolve | 1.0 part by weight |
| Potassium hydroxide | 1.0 part by weight |
| Water | 92.5 parts by weight |

The above negative-type PS plate and positive-type PS plate were indiscriminately processed with the above developer (A), whereby good printing plates without any problem could be obtained. Also, in the respective solution tanks of developer tank, water washing tank, substantially no foaming was observed.

EXAMPLES 2 to 6

An aluminum plate with a thickness of 0.24 mm was defatted by dipping in a 20% aqueous sodium phosphate solution, and electrolytically polished in a 0.2N hydrochloric acid bath at a current density of 3 A/m$^2$, followed by anodic oxidation in a sulfuric acid bath. At this time, the anodically oxidized amount was 4 g/m$^2$. Further, sealing treatment was applied with an aqueous sodium metasilicate solution to prepare an aluminum plate to be used for lithographic printing plate. Next, on the aluminum plate was applied the light-sensitive solution A shown below to obtain a negative-type PS plate and the light-sensitive solution B was applied to obtain a positive-type PS plate. Coating was performed by a rotary coating machine, followed by drying at 100° C. for 4 minutes. The coated film thickness weight was 2.5 g/cm$^2$ in both plates.

| (Light-sensitive solution A) | |
|---|---|
| Copolymer of N-(4-hydroxyphenyl)methacylamide: acrylonitrile:ethyl acrylate:methacrylic acid = 27:33:41:6 (weight ratio) (acid value = 80) | 5.0 g |
| Hexafluorophosphoric acid salt of paraformaldehyde condensate of p-diazodiphenylamine | 0.5 g |
| Julimer AC10L (trade name, produced by Nippon Junyaku K.K., acrylic acid polymer) | 0.05 g |
| Tartaric acid | 0.05 g |
| Victoria Pure Blue BOH (trade name, produced by Hodogaya Kagaku Kogyo K.K., dye) | 0.1 g |
| Novolac resin (PP-3121) (produced by Gun-ei Kagaku K.K.) | 0.15 g |
| Pluronic L-64 (trade name, produced by Asahi Denka K.K., surfactant) | 0.005 g |
| Methyl cellosolve | 100 ml |
| (Light-sensitive solution B) | |
| Condensate of naphthoquinone-(1,2)-diazide-(2)-5-sulfonic acid chloride and resorcin-benzaldehyde resin | 3.5 g |
| m-Cresol-formaldehyde novolac resin "MP-707" (trade name, produced by Gun-ei Kagaku Kogyo K.K.) | 9 g |
| Naphthoquinone-(1,2)-diazide-(2)-4-sulfonic acid chloride | 0.15 g |
| Victoria Pure Blue BOH (trade name, produced by Hodogaya Kagaku Kogyo K.K., dye) | 0.2 g |
| Methyl cellosolve | 100 g |

The plates thus obtained were exposed through a step wedge with a density difference of 0.15 by use of a 2 Kw metal halide lamp. Then, by use of the developer shown in Table 1, developing was carried out at 30° C. by means of an automatic developing machine by varying the developing time to obtain the results shown in Table 2.

The pH of the developer was adjusted after addition of the additives to 12.85 with 10% NaOH or 1N HCl immediately before use.

In Table 2, N plate represents a negative-type PS plate, P plate represents a positive-type PS plate, and gradation is the result of evaluation of the difference between the solid step number and the clear step number with the developing ink SPO-1 (produced by Konishiroku Photo Industry Co., Ltd.) being carried thereon. Also, over-developability is the result of evaluation when developed for the positive-type PS plate with the time which is twice that of the standard developing (here clear 5 steps).

COMPARATIVE EXAMPLES 1 to 5

In the same manner as in Examples 2 to 6 by using the developer shown in Table 1, developing was carried out in the same manner as shown above and the results are shown in Table 2.

plate more rapidly than the developer of the prior art, and yet broad in latitude of developing, with little foaming.

On the other hand, in the developer of Comparative example 1, since no organic carboxylic acid is contained, developability of the negative-type PS plate was

TABLE 1

| | Sodium silicate No. 3 | Water-soluble reducing agent | (Developer composition) Organic carboxylic acid | Surfactant | Organic solvent | KOH (% by weight) | Others |
|---|---|---|---|---|---|---|---|
| Example 2 | 3.0 wt. % | Sodium sulfite 1 wt. % | p-tert-Butyl-benzoic acid 4.0 wt. % | NIKKOL BO-20*¹ 0.1 wt. % | None | 1.0 | |
| Example 3 | 3.0 wt. % | Sodium sulfite 1 wt. % | 3-Hydroxy-2-naphthoic acid 4.0 wt. % | NIKKOL BO-20*¹ 0.1 wt. % | None | 1.0 | |
| Example 4 | 3.0 wt. % | Sodium sulfite 1 wt. % | 3-Hydroxy-2-naphthoic acid 4.0 wt. % | NIKKOL BO-20*¹ 0.1 wt. % | Phenyl cellosolve 1.0 wt. % | 1.0 | |
| Comparative example 1 | 3.0 wt. % | Sodium sulfite 1 wt. % | None | NIKKOL BO-20*¹ 0.1 wt. % | Phenyl cellosolve 1.0 wt. % | 1.0 | |
| Comparative example 2 | 3.0 wt. % | Sodium sulfite 1 wt. % | None | None | Phenyl cellosolve 1.0 wt. % | 1.0 | 4.0 wt. %*² |
| Comparative example 3 | 3.0 wt. % | None | n-capric acid 4.0 wt. % | None | Phenyl cellosolve 1.0 wt. % | 1.0 | |
| Example 5 | 3.0 wt. % | Sodium sulfite 1 wt. % | Sodium benzoic acid 4.0 wt. % | NIKKOL BO-20*¹ 0.1 wt. % | N-phenyl ethanol amine 1.0 wt. % | 1.0 | |
| Example 6 | 3.0 wt. % | Sodium sulfite 1 wt. % | Sodium benzoic acid 4.0 wt. % | NIKKOL BO-20*¹ 0.1 wt. % | Benzyl alcohol 1.0 wt. % | 1.0 | |
| Comparative example 4 | 3.0 wt. % | None | Lithium benzoic acid 4.0 wt. % | NIKKOL BO-20*¹ 0.1 wt. % | N-phenyl ethanol amine 1.0 wt. % | 1.0 | |
| Comparative example 5 | 3.0 wt. % | Sodium sulfite 1 wt. % | Lithium benzoic acid 4.0 wt. % | NIKKOL BO-20*¹ 0.1 wt. % | N-phenyl ethanol amine 1.0 wt. % | 1.0 | |

*¹Polyoxyethylenoleylether (produced by Nikko Chemicals K.K., nonionic type surfactant)
*²Sodium alkylnaphthalene sulfonate

TABLE 2

| | Developability*³ | | Stain at printing | | Latitude of positive-type PS plate (Rush step number) - (Clear step number) | Over developability | Foaming |
|---|---|---|---|---|---|---|---|
| | N plate | P plate | Negative PS plate | Positive PS plate | | | |
| Example 2 | ○ | ○ | None | None | ⊚ | ⊚ | Little |
| Example 3 | ○~⊚ | ○ | None | None | ⊚ | ⊚ | Little |
| Example 4 | ⊚ | ⊚ | None | None | ⊚ | ⊚ | Little |
| Comparative example 1 | X | ⊚ | None | None | ⊚ | ⊚ | Little |
| Comparative example 2 | Δ~○ | ⊚ | None | None | Δ Soft tone more than 9 step difference | Δ*⁴ | Large |
| Comparative example 3 | ○ | ⊚ | Large stain | None | ⊚ | Δ*⁴ | Little |
| Example 5 | ○ | ⊚ | None | None | ⊚ | ⊚ | Little |
| Example 6 | ○ | ⊚ | None | None | ⊚ | ⊚ | Little |
| Comparative example 4 | ○ | ⊚ | Large stain | None | ⊚ | ⊚ | Little |
| Comparative example 5 | ○ | ⊚ | Large stain | None | ⊚ | ⊚ | Little |

*³○ Developable within 15 seconds,
○~⊚ Developable within 20 seconds,
○ Developable within 25 seconds,
Δ~○ Developable within 30 seconds,
X Undeveloped for 60 seconds.
*⁴Detailed portion lacked.

As is apparent from the results shown in Table 2, the developer of the present invention can develop both of the negative-type PS plate and the positive-type PS extremely bad. In the developer of Comparative example 2, an anionic surfactant is contained in place of containing an organic carboxylic acid and a nonionic surfactant, and this was found to be slightly bad in developability for the negative-type PS plate, and was liable to be defective in the image at fine portion during over-developing for the positive-type PS plate. In the developer of Comparative example 3, contamination occurred in the negative PS plate during printing to pose a problem in practical application.

EXAMPLE 7

A 3S aluminum plate with a thickness of 0.24 mm was defatted by dipping in a 20% aqueous sodium phosphate solution, and electrolytically polished in a 0.2N hydrochloric acid bath at a current density of 3 A/m$^2$, followed by anodic oxidation in a sulfuric acid bath. At this time, the anodically oxidized amount was 4 g/m$^2$. Further, sealing treatment was applied with an aqueous sodium metasilicate solution to prepare an aluminum plate to be used for lithographic printing plate. Next, on the aluminum plate was applied the light-sensitive solution - A used in Example 1 with a wheeler, followed by drying at 85° C. for 3 minutes to obtain a light-sensitive lithographic printing plate (1).

The light-sensitive layer of the light-sensitive lithographic printing plate (1) obtained was found to have a film thickness of 18 mg/dm$^2$.

Next, the light-sensitive lithographic printing plate (1) was subjected to imagewise exposure by a metal halide lamp "Eyedolphin 2000", (trade name, produced by Iwasaki Denki K.K.) at a distance of 80 cm therefrom for 30 seconds, and then developed with Sakura PAS 860 PS plate automatic developing machine (produced by Konishiroku Photo Industry Co., Ltd.) by use of the developer composition (1) shown below at 27° C. for 40 seconds to obtain a lithographic printing plate.

| Developer composition (1) | |
| --- | --- |
| Sodium silicate (No. 3, solid 40%) | 1.7 g |
| Pionin A-44B (trade name, produced by Takemoto Yushi, sodium dibutylnaphthalenesulfonate, solid: 80%) | 2.0 g |
| p-n-Propylbenzoic acid | 8.0 g |
| Sodium sulfite | 1.0 g |
| Sodium hydroxide | 1.0 g |
| Water | 86.3 g |

The developer composition (1) had substantially no odor and preferable in working environment. Also, the finished plate was without residual film and excellent in developability.

Next, the lithographic printing plate was mounted on Heidelberg GTO type printer and printing was performed, whereby a sharp printed product without contamination could be obtained.

EXAMPLE 8

On the aluminum plate used in Example 7, the following light-sensitive solution - C was applied in the same manner as in Example 1 and dried to obtain a light-sensitive lithogrpahic printing plate (2).

| (Light-sensitive solution C) | |
| --- | --- |
| Copolymer of 2-hydroxyethyl methacylate:acrylonitrile:methyl methacrylate:methacrylic acid = 39:10:36:-15 (weight ratio) (acid value = 97) | 5.5 g |
| 2-Methoxy-4-hydroxy-5-benzoylbenzenesulfonic acid of paraformaldehyde condensate of p-diazodiphenylamine | 0.6 g |
| Tartaric acid | 0.05 g |

| (Light-sensitive solution C) | |
| --- | --- |
| Oil Blue (trande name, produced by Orient Kagaku K.K., dye) | 0.1 g |
| 2-Methoxyethanol | 33 g |
| Methanol | 33 g |
| Ethylene dichloride | 33 g |

The light-sensitive layer of the light-sensitive lithographic printing plate (2) obtained was found to have a film thickness of 19 mg/dm$^2$.

Next, the lithographic printing plate (2) was subjected to imagewise exposure in the same manner as in Example 7 and developed similarly as in Example 7 by use of the developer composition (2) shown below to obtain a lithographic printing plate.

| Developer composition (2) | |
| --- | --- |
| Monoethanolamine | 1.5 g |
| Pelex NBL (trade name, produced by Kao Atlas, sodium alkylnaphthalenesulfonate, solid: 35%) | 3.0 g |
| Potassium hydroxide | 3.0 g |
| p-n-Butylbenzoic acid | 9.0 g |
| Benzyl alcohol | 1.5 g |
| Sodium sulfite | 0.5 g |
| Water | 81.5 g |

The above developer composition (2) exhibited good developability with addition of a relatively smaller amount of an organic solvent, which was found to be a developer with low toxicity and danger. Also, the above developer composition from which p-n-butylbenzoic acid was removed (Comparative (4)) was found to be extremely bad in developability, having substantially no developing ability.

EXAMPLE 9

An aluminum plate with a thickness of 0.24 mm was defatted by dipping in a 20% aqueous sodium phosphate solution, and electrolytically polished in a 0.2N hydrochloric acid bath at a current density of 3 A/m$^2$, followed by anodic oxidation in a sulfuric acid bath. At this time, the anodically oxidized amount was 4 g/m$^2$. Further, sealing treatment was applied with an aqueous sodium metasilicate solution to prepare an aluminum plate to be used for lithographic printing plate. Next, on the aluminum plate was applied the light-sensitive solution - A shown in Example 1 to obtain a negative-type light-sensitive lithographic printing plate, and after sandblasting the light-sensitive solution - A shown in Example 1 was applied on the aluminum plate subjected to anodic oxidation to obtain a positive-type light-sensitive lithographic printing plate. Coating was performed by a rotary coating machine, followed by drying at 100° C. for 4 minutes. The coated film thickness weight was 2.5 g/m$^2$ in both plates.

The negative-type and positive-type light-sensitive lithographic printing plates thus obtained were exposed through a step wedge with a density difference of 0.15 by use of a 2 Kw metal halide lamp. Then, by use of the developer composition (6), developing was carried out at 25° C. by means of an automatic developing machine.

The pH of the developer was adjusted after addition of the additives to 12.65 with 10% NaOH or 1N HCl immediately before use.

| Developer composition (6) | |
| --- | --- |
| Sodium silicate (sodium silicate No. 3 of Japanese Industrial Standard) | 250 g |
| Sodium hydroxide | 100 g |
| p-t-Butylbenzoic acid | 500 g |
| Benzyl alcohol | 200 g |
| Sodium sulfite | 150 g |
| Emulgen A-500 (trade name, produced by Kao K.K., nonionic surfactant) | 10 g |
| Water | 10 liter |

By use of the above developer, the above negative-type and positive-type light-sensitive lithographic printing plates were developed indiscriminately, whereby both plates could be well developed. When printing was performed by mounting the lithographic printing plate obtained by developing on Hidelberg GTO type printer, sharp printed products without contamination could be obtained in both the negative-type and positive-type lithographic printing plates. Also, workability was excellent, because there was substantially no odor and foaming.

EXAMPLE 10

After a negative-type PS plate used in Example 2 was subjected to image exposure, developing processing was carried out by use of the following developer compositions (7) (the present invention) and (8) (comparative developer) in the same manner as in Example 1.

| Developer composition | (7) | (8) |
| --- | --- | --- |
| Sodium silicate (JIS No. 3) | 5.0 g | 5.0 g |
| Potassium hydroxide | 2.0 g | 2.0 g |
| Potassium sulfite | 1.0 g | 1.0 g |
| 2-Hydroxy-4-n-propylbenzoic acid | 3.0 g | — |
| 2-Hydroxy benzoic acid | — | 3.0 g |
| β-Anilino ethanol | 0.5 g | 0.5 g |
| Emulgen 147 (trade name, produced by Kao K.K., nonionic surfactant) | 0.1 g | 0.1 g |
| Water | 100 g | 100 g |

When printing was performed by using the plate processed with the developer composition (7), good printing products without contamination can be obtained. On the other hand, when printing was performed by using the plate processed with the developer composition (8) in the same manner as the above, contamination was occurred.

EXAMPLE 11

After a negative-type PS plate used in Example 2 was subjected to image exposure, developing processing was carried out by use of the following developer compositions (9) (the present invention) and (10) (comparative developer) in the same manner as in Example 1.

| Developer composition | (9) | (10) |
| --- | --- | --- |
| Sodium silicate (JIS No. 3) | 5.0 g | 5.0 g |
| Potassium hydroxide | 2.0 g | 2.0 g |
| Potassium sulfite | 1.0 g | 1.0 g |
| 4-n-Propyl benzoic acid | 3.0 g | — |
| 4-Methyl benzoic acid | — | 3.0 g |
| β-Anilino ethanol | 0.5 g | 0.5 g |
| Emulgen 147 (trade name, produced by Kao K.K., nonionic surfactant) | 0.1 g | 0.1 g |

-continued

| Developer composition | (9) | (10) |
| --- | --- | --- |
| Water | 100 g | 100 g |

When printing was performed by using the plate processed with the developer composition (9), good printing products without contamination can be obtained. On the other hand, when printing was performed by using the plate processed with the developer composition (10) in the same manner as the above, contamination was occurred.

According to the present invention, when the negative-type PS plate and the positive-type PS plate are developed with one developer (for example, when the negative-type and the positive-type PS plates are indiscriminately developed with the same developer by an automatic developing machine), developability, printability and developing speed can be improved. Besides, the developer of the present invention is excellent in workability due to substantial absence of foaming.

Conventionally, there have been the method for rapid developing to increase the concentration of the developer or the processing temperature, or to add an additive having the effect of developing acceleration such as an organic solvent, but either method proved to be narrow in developing latitude and difficult in obtaining a stable and good image in the prior art. However, in the present invention, stable and good images can be obtained even by performing rapid developing.

The developer composition according to the present invention can well a light-sensitive material containing a lipophilic substance, excellent in workability without odor, and can also improve the problem in safety and hygiene.

What is claimed is:

1. An aqueous alkaline developer for a light-sensitive lithographic printing plate comprising:
   (a) an alkali agent;
   (b) 0.1 to 10% by weight of a water soluble sulfite;
   (c) at least 0.1% by weight of a compound selected from the group consisting of p-n-propylbenzoic acid, p-isopropylbenzoic acid, p-t-butylbenzoic acid and p-n-butylbenzoic acid; and,
   (d) one of a nonionic surfactant and a cationic surfactant,
wherein said developer has a pH in the range of from 12.5 to 13.5

2. The developer according to claim 1, wherein said alkali agent is a silicate of an alkali metal.

3. The developer according to claim 1, wherein said nonionic or cationic surfactant is in the range of 0.001 to 5% by weight.

4. The developer according to claim 1, wherein said developer contains an organic solvent.

5. The developer according to claim 4, wherein said organic solvent has a solubility of 10% or less in water.

6. The developer according to claim 5, wherein said organic solvent is selected from benzyl alcohol, phenyl cellosolve, N-phenylethanol amine or N-phenyldiethenol amine.

7. The aqueous alkaline developer according to claim 1, wherein said compound is selected from the group consisting of p-n-propylbenzoic acid, p-isopropylbenzoic acid and p-t-butylbenzoic acid.

8. The aqueous alkaline developer of claim 1, wherein said developer will develop a negative light-sensitive lithographic printing plate in 20 seconds or less.

* * * * *